(12) United States Patent
Furukawa et al.

(10) Patent No.: US 10,060,028 B2
(45) Date of Patent: Aug. 28, 2018

(54) CHARGING MEMBER, MANUFACTURING METHOD THEREFOR, A PROCESS CARTRIDGE, AND ELECTROPHOTOGRAPHIC APPARATUS

(71) Applicant: CANON KABUSHIKI KAISHA, Tokyo (JP)

(72) Inventors: Takumi Furukawa, Susono (JP); Taichi Sato, Numazu (JP)

(73) Assignee: Canon Kabushiki Kaisha, Tokyo (JP)

( * ) Notice: Subject to any disclaimer, the term of this patent is extended or adjusted under 35 U.S.C. 154(b) by 94 days.

(21) Appl. No.: 15/213,182

(22) Filed: Jul. 18, 2016

(65) Prior Publication Data

US 2016/0326640 A1 Nov. 10, 2016

Related U.S. Application Data

(62) Division of application No. 14/127,864, filed as application No. PCT/JP2012/065936 on Jun. 15, 2012, now abandoned.

(30) Foreign Application Priority Data

Jun. 21, 2011 (JP) ................................ 2011-137340

(51) Int. Cl.
*G03G 5/02* (2006.01)
*C23C 14/58* (2006.01)
*G03G 21/18* (2006.01)
*G03G 15/02* (2006.01)

(52) U.S. Cl.
CPC ......... *C23C 14/58* (2013.01); *G03G 15/0233* (2013.01); *G03G 21/18* (2013.01); *G03G 5/02* (2013.01); *G03G 15/0241* (2013.01); *G03G 2215/0863* (2013.01); *Y10T 428/22* (2015.01)

(58) Field of Classification Search
CPC ................ C23C 14/58; G03G 15/0233; G03G 15/0818; G03G 15/02; G03G 15/0241; G03G 21/18; G03G 2215/025; G03G 2215/0863; G03G 5/02
See application file for complete search history.

(56) References Cited

U.S. PATENT DOCUMENTS

2012/0070586 A1* 3/2012 Seko .................... B29C 41/085
427/385.5

FOREIGN PATENT DOCUMENTS

JP 2008-013691 A1 * 1/2008

* cited by examiner

*Primary Examiner* — Christopher Besler
(74) *Attorney, Agent, or Firm* — Canon U.S.A., Inc. IP Division

(57) ABSTRACT

To provide a charging member which suppresses the generation of density nonuniformity in an electrophotographic image caused by charge nonuniformity due to adhesion of charged substances, such as toner particles. There is provided a charging member which has a surface layer, the surface layer includes conductive zinc oxide whiskers each formed of a nuclear portion and four needle crystal portions extending radially outward therefrom, and the needle crystal portions are exposed to form convex portions of a surface of the surface layer.

5 Claims, 6 Drawing Sheets

CHARGING MEMBER, MANUFACTURING METHOD THEREFOR, A PROCESS CARTRIDGE, AND ELECTROPHOTOGRAPHIC APPARATUS

CROSS-REFERENCE TO RELATED APPLICATIONS

This application is a divisional of U.S. patent application Ser. No. 14/127,864 filed Dec. 19, 2013, which claims the benefit of International Appl. No. PCT/JP2012/065936 filed Jun. 15, 2012 and Japanese Patent Application No. 2011-137340 filed on Jun. 21, 2011, all of which are hereby incorporated by reference herein in their entirety.

TECHNICAL FIELD

The present invention relates to a charging member, a manufacturing method therefor, a process cartridge, and an electrophotographic apparatus.

BACKGROUND ART

In an electrophotographic apparatus, a contact charging method is used in many cases in which a roller-shaped charging member (hereinafter referred to as "charging roller") is brought into contact with an electrophotographic photosensitive member, and only a direct current voltage, (hereinafter referred to as "DC charging method") or a superposed voltage of a direct current voltage and an alternating current voltage (hereinafter referred to as "AC+DC superposed charging method") is applied to charge the electrophotographic photosensitive member.

The DC charging method is preferably used in view of low cost and reduction in size of apparatus. However, compared with the AC+DC superposed charging method, the DC charging method has a narrow discharge region and cannot obtain an effect of uniforming a charged potential by an AC discharge current. Therefore, when only a direct current voltage is applied between a charging member having a locally uneven resistance on its surface and an electrophotographic photosensitive member, nonuniformity is generated in surface charge of the electrophotographic photosensitive member due to the uneven resistance, and as a result, density nonuniformity in the form of transverse streaks may be generated in an electrophotographic image in some cases.

In PTL 1, in order to overcome the above problem, a technique has been disclosed in which insulating particles are contained in a surface layer of a charging member to form convex portions derived from the insulating particles.

CITATION LIST

Patent Literature

PTL 1 Japanese Patent Laid-Open No. 2010-113177

SUMMARY OF INVENTION

Technical Problem

However, the particle diameter of toner has been further decreased in order to satisfy requirements in recent years for improvement in image quality of an electrophotographic image. In addition, concomitant with improvement in functions of toner, various external additives have been increasingly used. In view of suppression of stain adhesion on the surface of a charging member which occurs when the charging member is used for a long time, these technical trends described above move toward a more disadvantageous. In addition, the charging member itself has been required to have a further superior durability.

Accordingly, the present invention is directed to providing a charging member which is unlikely to generate potential nonuniformity on an electrophotographic photosensitive member and hence which can form a high quality electrophotographic image and a method for manufacturing the charging member.

In addition, the present invention is directed to providing a process cartridge and an electrophotographic apparatus, each of which can stably form a high quality electrophotographic image.

Solution to Problem

According to one aspect of the present invention, there is provided a charging member comprising a surface layer which includes conductive zinc oxide whiskers each having a nuclear portion and four needle crystal portions extending radially outward therefrom, and at least one of the needle crystal portions is exposed on the surface of the surface layer so as to form a convex portion on the surface of the surface layer.

According to another aspect of the present invention, there is provided a charging member comprising: a conductive base; and a surface layer comprising conductive zinc oxide whiskers each have a nuclear portion and four needle crystal portions extending radially outward therefrom and are partially buried in the surface layer, and at least one of the needle crystal portions is exposed on a surface of the surface layer so as to form a convex portion on a surface of the surface layer.

According to further aspect of the present invention, there is provided a method for manufacturing a charging member provided with a surface layer, the surface layer comprising conductive zinc oxide whiskers each having a nuclear portion and four needle crystal portions extending radially outward therefrom, and at least one of the needle crystal portions are exposed on a surface of the surface layer so as to form a convex portion on a surface of the surface layer, wherein:

the method comprises (1) forming a resin layer used as a base of the surface layer;
(2) dispersing the conductive zinc oxide whiskers in a poor solvent for a resin forming the resin layer;
(3) applying a dispersion obtained in the step (2) on the resin layer, and
(4) melting the resin layer processed in the step (3) to bury a part of the conductive zinc oxide whiskers in the resin layer.

According to further aspect of the present invention, there is provided a process cartridge comprising:
an electrophotographic photosensitive member; and
the aforementioned charging member, wherein the process cartridge is detachable and mountable to a main body of an electrophotographic apparatus.

According to still further aspect of the present invention, there is provided an electrophotographic apparatus comprising:
an electrophotographic photosensitive member; and
the aforementioned charging member.

Advantageous Effects of Invention

According to the present invention, a charging member can be obtained which is unlikely to generate charge non-uniformity on an electrophotographic photosensitive member and which can form a high quality electrophotographic image. In addition, according to the present invention, a process cartridge and electrophotographic apparatus, each of which can stably form a high quality electrophotographic image, can be obtained.

DESCRIPTION OF EMBODIMENTS

In the case in which an electrophotographic photosensitive member is brought into contact with a charging roller having convex portions derived from insulating particles contained in the surface layer disclosed in PTL 1 and is charged by a DC charging method, the present inventors investigated a mechanism in which density nonuniformity caused by charge nonuniformity is liable to generate in an electrophotographic image as the number of output images is increased. As a result, it is believed that by the following mechanism, the density nonuniformity is generated in an electrophotographic image.

Figure 6:
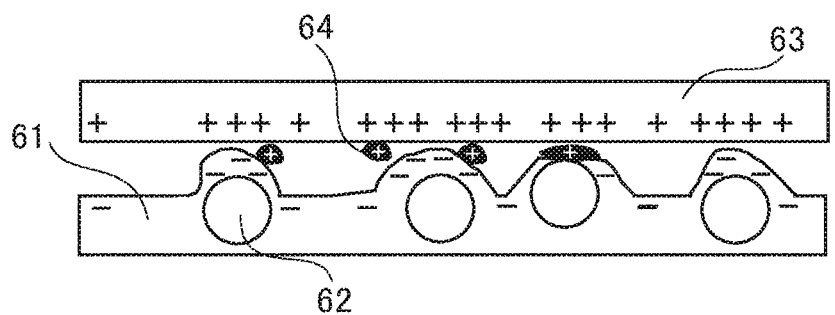
FIG. 6 is a schematic view illustrating adhesion of substances, such as toner, at a nip portion between an electrophotographic photosensitive member and a charging member having a surface layer which has convex portions derived from insulating particles.

That is, as shown in FIG. 6, a convex portion 62 derived from an insulating particle of a surface layer 61 is close to an electrophotographic photosensitive member 63 as compared with the other places other than the convex portion, and hence an electric field applied between the convex portion and the electrophotographic photosensitive member is high. In addition, since the convex portion 62 is formed of the insulating particle, a charge thereof is not likely to escape. Therefore, a charge is likely to be accumulated in the convex portion 62.

On the other hand, substances 64, such as toner particles and external additives, which adhere to the charging member in an electrophotographic apparatus, first adhere to the electrophotographic photosensitive member and are then transferred to the charging member. Since being charged in various polarities by the potentials of other members to be rubbed with the electrophotographic photosensitive member and the triboelectric series of materials, these substances 64 are liable to adhere to portions of the surface of the charging member at which the electric field is high. Therefore, when the charging member having a surface layer which has convex portions derived from insulating particles is used, the charged substances 64 are liable to adhere to the convex portions. In addition, when the charging member as described above is used for a long time, the substances 64 accumulate on the convex portions to cause charge nonuniformity of the electrophotographic photosensitive member, and as a result, the density nonuniformity caused by the charge nonuniformity is generated in an electrophotographic image.

Based on this finding, the present inventors made the present invention. Hereinafter, a charging member according to the present invention will be described in detail.

Figure 1:
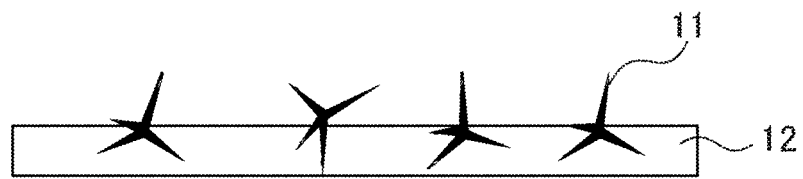
FIG. 1 is a schematic view of a surface of a charging member according to the present invention.
Figure 2:
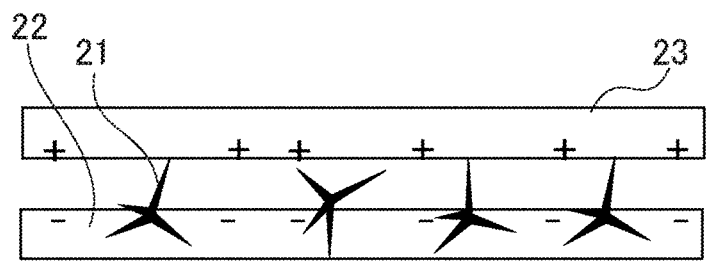
FIG. 2 is a schematic view illustrating suppression of adhesion of substances, such as toner, at a nip portion between the charging member according to the present invention and an electrophotographic photosensitive member.

FIG. 1 is a schematic view showing a cross section perpendicular to a surface direction of the charging member according to the present invention. As shown in FIG. 1, conductive zinc oxide whiskers 11 each formed of a nuclear portion and four needle crystal portions extending radially outward therefrom are partially exposed to form convex portions of surface of the charging member. Non-exposed portions of the conductive zinc oxide whiskers 11 each formed of a nuclear portion and four needle crystal portions extending radially outward therefrom are buried in a surface layer 12. Hereinafter, unless otherwise particularly stated, the conductive zinc oxide whiskers each formed of a nuclear portion and four needle crystal portions extending radially outward therefrom are called four-needle zinc oxide whiskers.

In the present invention, the needle crystal portion of the four-needle zinc oxide whisker exposed from the surface functions as a convex portion to be in contact with the electrophotographic photosensitive member. The present inventors considered that the convex portions of the four-needle zinc oxide whiskers suppress the adhesion of charged substances by the following mechanism.

First, since the four-needle zinc oxide whisker has conductivity, charge is not likely to be accumulated in the convex portion itself, and hence an electrostatic attraction force is not likely to be generated between the convex portion and the charged substance. In addition, when the needle crystal portion of the four-needle zinc oxide whisker comes into contact with a charged substance, the charge thereof is relieved, and the electrostatic adhesion force of the substance is decreased.

Furthermore, since the convex portion of the surface of the charging member has a needle shape, a substance is suppressed from being crushed in a nip between the charging member and the electrophotographic photosensitive member.

In addition, the four-needle zinc oxide whisker has a nuclear portion and four needle crystal portions extending radially outward therefrom and is partially buried in the surface layer. Therefore, compared with zinc oxide whiskers each having a spherical or a massive shape, or each having only one needle crystal portion, the four-needle zinc oxide whisker is suppressed from being eliminated from the surface layer. That is, although having a needle shape, the convex portion has a strength durable for a long term use. By the reason as described above, the present inventors believed that the adhesion of charged substances can be suppressed.

Hereinafter, the structure of the charging member according to the present invention will be described in detail.

[Surface Layer]

The surface layer comprises the four-needle zinc oxide whiskers, and the needle crystal portions thereof are exposed on a surface of the surface layer so as to form convex portions of a surface of the surface layer.

Hereinafter, constituent components of the surface layer as described above will be described.

[Four-Needle Zinc Oxide Whiskers]

The four-needle zinc oxide whisker is formed of a nuclear portion and four needle crystal portions extending radially outward therefrom, the nuclear portion is located at the center of gravity of a regular tetrahedron, and the needle crystal portions extend therefrom toward the four peaks of the tetrahedron. The average length of the needle crystal portion as a guideline is approximately 2 to 50 μm and may be approximately equivalent to the surface roughness required as the charging member.

The average aspect ratio as a guideline is approximately 10 to 200, and the needle crystal portion may have a thickness which is not fractured when being rubbed with other members in an electrophotographic apparatus. When the shape of the needle crystal portion is formed in the range described above, a convex portion of the needle crystal portion suitable for the present invention can be formed. Although being not particularly limited, the grain diameter of the nuclear portion may be approximately equivalent to the diameter of a base portion of the needle crystal portion. The average length and the average aspect ratio of the needle crystal portion can be measured as described below.

By using an electron microscope (trade name: "S-4800", manufactured by Hitachi Co., Ltd.), the conductive zinc oxide whisker is observed from an arbitrary angle, and the diameter of the base portion of each of the four needle crystal portions and the length thereof from the base portion to the top are measured. In this case, the base portion indicates a portion at which the needle crystal portion is connected to the nuclear portion.

The maximum values among the values obtained by measuring the four needle crystal portions are regarded as the base portion diameter of the needle crystal portion and the length thereof. By the above measuring method, 100 conductive zinc oxide whiskers are measured, and the arithmetic averages are regarded as the average base portion diameter of the needle crystal portion and the average length thereof. In addition, the average aspect ratio of the needle crystal portion is calculated from the following formula (1).

Average aspect ratio=average length of needle crystal portion/average base portion diameter of needle crystal portion     Formula (1)

In addition, as the conductivity of the zinc oxide, the volume resistivity may be $1.0 \times 10^3$ ohm·cm or less.

[Surface Layer]

The surface layer may comprise a thermosetting resin, a thermoplastic resin, a rubber, and a thermoplastic elastomer may be used. Specifically, for example, a urethane resin, a fluorine resin, a silicone resin, an acrylic resin, a polyamide resin, a butyral resin, a styrene-ethylene/butylene-olefin copolymer, and an olefin-ethylene/butylene-olefin copolymer may be mentioned. Those resins mentioned above may be used alone, or at least two types thereof may be used in combination. Since being excellent in release properties from the electrophotographic photosensitive member and stain resistance, a thermosetting resin is particularly preferable among these mentioned above. In particular, for example, a thermosetting urethane resin may be mentioned.

In the above surface layer, for example, an ion conductive agent and an electronic conductive agent may be contained without departing from the scope of the present invention. In addition, for example, in order to improve the uniformity in resistance, adjust the dielectric constant, and adjust the elastic modulus of the surface layer, inorganic particles may also be added to the surface layer. As the inorganic particles, particles of silica or titanium oxide are preferable.

[Exposed Average Length and Exposed Average Aspect Ratio of Needle Crystal Portion of Four-Needle Zinc Oxide Whisker]

The exposed average length and the exposed average aspect ratio of the needle crystal portion can be measured as described below.

By using an electron microscope (trade name: "S-4800", manufactured by Hitachi Co., Ltd.), the needle crystal portion exposed on the surface is observed from an arbitrary angle, and the diameter of an exposed base portion of the needle crystal portion and the length thereof from the exposed base portion to the top are measured. In this case, the exposed base portion is a root of a part of the needle crystal portion which is exposed on the surface of the surface layer so as to form the convex portion. The arithmetic averages obtained by measuring 100 needle crystal portions are regarded as the exposed average base portion diameter of the needle crystal portion and the exposed average length thereof. In addition, the exposed average aspect ratio of the needle crystal portion is calculated from the following formula (2).

Exposed average aspect ratio=exposed average length of needle crystal portion/exposed average base portion diameter of needle crystal portion     Formula (2)

An effect of suppressing adhesion of charged substances is high when the exposed average length is 5 μm or more, and the exposed average aspect ratio is 10 or more. In addition, it is preferable that the upper limit of the exposed average length be set to 19 μm, and the upper limit of the exposed average aspect ratio be set to 30.

[Method for Burying Four-Needle Zinc Oxide Whiskers in Resin Layer]

The surface layer of the present invention is obtained by burying parts of the four-needle zinc oxide whiskers in a resin layer as the base of the surface layer. Although a method for burying the four-needle zinc oxide whiskers is not particularly limited, for example, a method may be mentioned in which a surface layer is formed by the following steps (1) to (4) so that the needle crystal portions are exposed from the surface of the resin layer to form the convex portions of a surface of the surface layer.

(1) A step of forming the resin layer used as the base of the surface layer.

(2) A step of dispersing the four-needle zinc oxide whiskers in a poor solvent for a resin forming the resin layer.

(3) A step of applying a dispersion obtained in the step (2) on the resin layer.

(4) A step of burying parts of the four-needle zinc oxide whiskers in the resin layer by melting the resin layer processed in the step (3).

The method described above is preferable since the steps are simple, the degree of freedom of the four-needle zinc oxide whiskers controlling the adhesion is high, and the degree of burying of the four-needle zinc oxide whiskers can be adjusted.

[Step (1)]

Although a method for forming the resin layer is not particularly limited, for example, a method for applying a material of the resin layer as a coating material may be mentioned. As a coating method, for example, slit coating, roll coating, ring coating, spray coating, and dipping coating may be mentioned.

The thickness of the resin layer can be changed by appropriately adjusting the solid content, viscosity, coating velocity, and the like of a resin-layer coating material. The thickness can be increased when the solid content contained in the resin-layer coating material is high, the viscosity thereof is high, and the coating velocity is high, and the four-needle zinc oxide whiskers can be buried deeply. The thickness is obtained by observing and measuring arbitrary plural points of the surface layer using an optical microscope or an electron microscope, and the average value thereof can be used as the thickness.

The thickness of the resin layer is preferable 0.2 to 2 times the major axis of the needle crystal portion of the four-needle zinc oxide whisker. When the thickness is in the above range, the four-needle zinc oxide whisker may have a proper exposed average length and, at the same time, is sufficiently buried so as not to be eliminated.

[Step (2)]

As the solvent which disperses the four-needle zinc oxide whiskers, a poor solvent which is not likely to dissolve the resin for the resin layer, is used. As a dispersion machine, a wet dispersion machine, which is commonly used for dispersing a coating material, may be used. The average length of the exposed needle crystal portion can be controlled by selecting the diameter of the four-needle zinc oxide whiskers. In addition, the amount of the four-needle zinc oxide whiskers to be applied on the resin layer can be controlled by the concentration of the four-needle zinc oxide whiskers in the solvent.

[Step (3)]

As a method for applying the dispersion obtained in Step (2) on this resin layer, for example, slit coating, roll coating, ring coating, spray coating, and dipping coating may be used. After Step (3) is completed, the four-needle zinc oxide whiskers are not buried in the resin layer and are adhered thereto.

[Step (4)]

The conductive zinc oxide whiskers are partially buried in this resin layer by melting this resin layer. As a heating device used for melting the resin layer, a known heating device, such as a hot air drying furnace, may be used. The depth in which the four-needle zinc oxide whiskers are buried can be controlled by a heating condition. In the case of a thermoplastic resin layer, the four-needle zinc oxide whiskers are deeply buried in the resin layer as the heating temperature is higher, and the heating time is longer. In addition, in the case of a thermosetting resin layer, the four-needle zinc oxide whiskers are deeply buried in the resin layer when the heating temperature is lower than a crosslinking temperature, and the heating time is longer.

[Conductive Base]

As a material of a conductive base, for example, metals, such as iron, copper, stainless steel, aluminum, and nickel, and alloys thereof may be mentioned.

Figure 3:
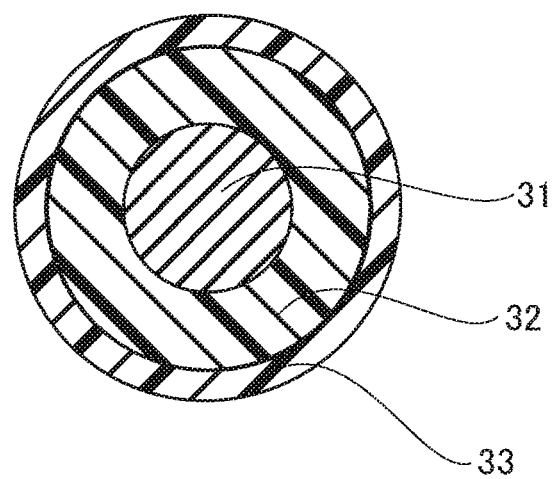
FIG. 3 is a cross-sectional view of a charging roller according to the present invention.

The charging member of the present invention may have another layer having a different function as long as the functions of the conductive base and the surface layer are not degraded. In addition, the shape of the charging member is not particularly limited as long as the shape can be used in contact with the electrophotographic photosensitive member, such as a roller, a belt, or a pad. As one type of charging member, as shown in FIG. 3, a charging roller in which a conductive elastic layer 32 is provided between a conductive base 31 and a surface layer 33 may be mentioned.

[Electrophotographic Apparatus]

Figure 4:
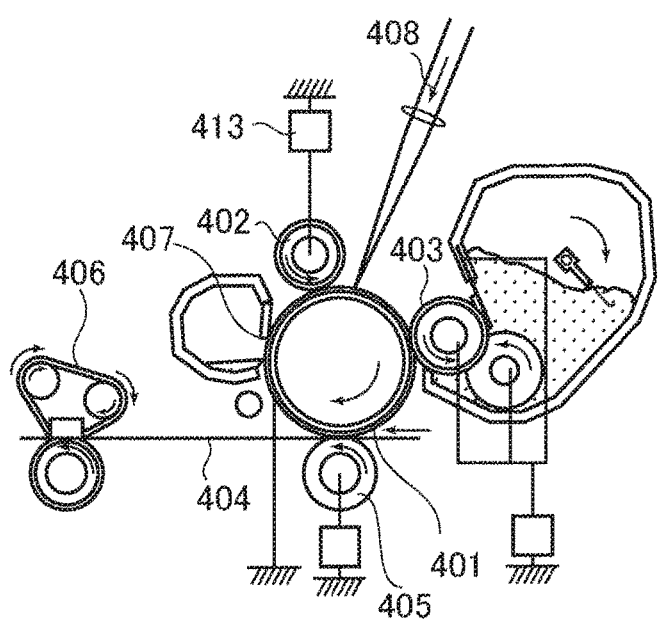
FIG. 4 is a schematic view showing one example of an electrophotographic apparatus.

FIG. 4 is a cross-sectional view of an electrophotographic apparatus which uses a charging roller of the present invention. The electrophotographic apparatus includes an electrophotographic photosensitive member 401, a charging roller 402 charging this photo conductor, an exposing device (not shown) which emits exposure light 408 for latent image formation, a developing device 403, a transfer device 405 performing transfer onto a transfer material 404, a cleaning blade 407, and a fixing device 406. The electrophotographic photosensitive member 401 is a rotary drum type having a photosensitive layer on a conductive base. The electrophotographic photosensitive member 401 is rotated at a predetermined circumferential speed (process speed) in an arrow direction. The charging roller 402 is pressed to the electrophotographic photosensitive member 401 at a predetermined force so as to be arranged in contact therewith. The charging roller 402 is rotated following the rotation of the electrophotographic photosensitive member 401, and a predetermined voltage is applied thereto from a charging power source 413, so that the electrophotographic photosensitive member 401 is charged at a predetermined potential. As a latent image formation device which forms a latent image on the electrophotographic photosensitive member 401, for example, an exposing device, such as a laser beam scanner, is used. An electrostatic latent image is formed on the uniformly charged electrophotographic photosensitive member 401 by performing exposure corresponding to image information. The developing device 403 has a contact type developing roller arranged in contact with the electrophotographic photosensitive member 401. By reversal development of toner processed by an electrostatic treatment to have the same polarity as the charge polarity of the photosensitive member, a toner image is formed from the electrostatic latent image by visualization development. The transfer device 405 has a contact type transfer roller. The toner image is transferred from the electrophotographic photosensitive member 401 onto the transfer material 404, such as plain paper. The cleaning blade 407 mechanically scrapes off a transfer residual toner remaining on the electrophotographic photosensitive member 401 for recovery. The fixing device 406 is formed of a heating roller and the like and fixes the toner image transferred on the transfer material 404.

Figure 5:
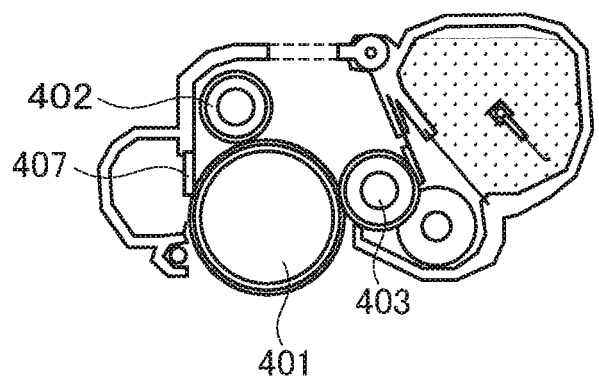
FIG. 5 is a schematic view showing one example of a process cartridge.

FIG. 5 is a cross-sectional view showing a process cartridge in which for example, the charging roller 402 according to the present invention, the electrophotographic photosensitive member 401, the developing device 403, and the cleaning blade 407 are integrally supported and which is detachable and mountable to a main body of the electrophotographic apparatus.

The charging roller of the present invention is preferable as a charging roller of such an electrophotographic apparatus and a process cartridge. Furthermore, when an AC+DC superposed voltage is applied from the charging power source, although a characteristic charging sound may be generated in some cases, the charging sound can be reduced when the charging roller of the present invention is used. The charging sound is generated by an electrostatic force applied between the electrophotographic photosensitive member and the charging roller. In the charging roller of the present invention, since the needle crystal portion of the four-needle zinc oxide whisker is exposed to form the convex portion, a gap formed between the electrophotographic photosensitive member and the charging roller is increased. Therefore, compared with a related charging roller which forms convex portions derived from insulating particles contained in the surface layer, the electrostatic force is decreased. That is, when the electrophotographic photosensitive member and the charging roller are regarded as electrode plates forming a capacitor, since the electrostatic capacitance is decreased, the electrostatic force applied to the electrophotographic photosensitive member and the charging roller is decreased, and as a result, the charging sound can be reduced.

EXAMPLES

Hereinafter, with reference to specific examples, the present invention will be described in more detail.
[Production of Zinc Oxide Dispersion]

Manufacturing Example 1

Conductive zinc oxide whiskers (trade name: Pana-Tetra WZ-501L, manufactured by AMTEC Co., Ltd.) each formed of a nuclear portion and four needle crystal portions extending radially outward therefrom were prepared. To 100 parts by mass of isopropyl alcohol, 10 parts by mass of the four-needle zinc oxide whiskers were dispersed, and this dispersion was allowed to pass through a metal mesh (mesh No. 325, opening: 0.043 mm), so that a zinc oxide dispersion 1 was obtained.

The average length of the needle crystal portions was 21 μm, and the average aspect ratio was 43.

Manufacturing Example 2

Except that conductive zinc oxide whiskers (trade name: Pana-Tetra WZ-501, manufactured by AMTEC Co., Ltd.) each formed of a nuclear portion and four needle crystal portions extending radially outward therefrom were used instead of using the zinc oxide whiskers of Manufacturing Example 1, and that a dispersion was not allowed to pass through a metal mesh, a zinc oxide dispersion 2 was obtained in a manner similar to that in Manufacturing Example 1. The average length of the needle crystal portions was 10 μm, and the average aspect ratio was 34.

Manufacturing Example 3

Except that a dispersion was allowed to pass through a metal mesh (mesh No. 635, opening: 0.020 mm) unlike the case of Manufacturing Example 2, a zinc oxide dispersion 3 was obtained in a manner similar to that in Manufacturing Example 2. The average length of the needle crystal portions was 6 μm, and the average aspect ratio was 26.

Manufacturing Example 4

Except that massive insulating zinc oxide whiskers (trade name: LPZINC-11, manufactured by Sakai Chemical Industry Co., Ltd.) were used instead of using the zinc oxide whiskers of Manufacturing Example 1, and that a dispersion was not allowed to pass through a metal mesh, a zinc oxide dispersion 4 was obtained in a manner similar to that in Manufacturing Example 1. The average particle diameter of the massive zinc oxide whiskers was 11 μm.
[Production of Composite Electron Conductive Agent]

Manufacturing Example 5

There will be described the production of a conductive agent in which carbon black covers silica particles with a methyl hydrogen polysiloxane provided therebetween and which is a composite electron conductive agent to be added to the resin layer.

First, 140 g of a methyl hydrogen polysiloxane was added to 7.0 kg of silica particles (average particle diameter: 15 nm, volume resistivity: $1.8 \times 10^{12}$ ohm·cm) while an edge runner was driven. Next, mixing and stirring were performed for 30 minutes at a line load of 588 N/cm (60 kg/cm) and a stirring speed of 22 rpm. To the mixture thus prepared, 7.0 kg of carbon black particles (particle diameter: 28 nm, volume resistivity: $1.0 \times 10^{2}$ ohm·cm) was added for 10 minutes while an edge runner was driven, and furthermore, mixing and stirring were performed for 60 minutes at a line load of 588 N/cm (60 kg/cm) and a stirring speed of 22 rpm. Subsequently, drying was performed for 60 minutes at a temperature of 80° C. using a dryer, so that the composite electron conductive agent was obtained. The composite electron conductive agent thus obtained had an average particle diameter of 47 nm and a volume resistivity of $2.3 \times 10^{2}$ ohm·cm.
[Production of Surface-Treated Titanium Oxide Particles]

Manufacturing Example 6

The production of surface-treated titanium oxide particles to be added to the resin layer will be described. To 1,000 g of needle-like rutile type titanium dioxide particles (average particle diameter: 15 nm, volume resistivity: $5.2 \times 10^{10}$ ohm·cm), 110 g of isobutyl trimethoxysilane as a surface treatment agent and 3,000 g of toluene as a solvent were added, so that a slurry was prepared. This slurry was mixed for 30 minutes by a stirrer and was then supplied to a Visco mill, 80% of the effective content volume of which is occupied by glass beads having an average particle diameter of 0.8 mm, and a wet cracking treatment was performed at a temperature of 35±5° C. The slurry obtained by the wet cracking treatment was processed by vacuum distillation to remove toluene, and the surface treatment agent was processed by a baking treatment at a temperature of 120° C. for 2 hours. The particles processed by the baking treatment were cooled to room temperature and were then pulverized by a pin mill, so that surface-treated titanium oxide particles having an average particle diameter of 17 nm were obtained.
[Production of Elastic Layer with Conductive Base]

Manufacturing Example 7

A thermosetting adhesive (trade name: Metaloc N-33, manufactured by Toyokagaku Kenkyusho Co., Ltd.) was applied to iron cylinder 6 mm in diameter and 252.5 mm in length and was then dried, and this coated cylinder was used as a conductive base.

Materials shown in Table 1 were kneaded together for 10 minutes by a closed type mixer at an adjusted temperature of 50° C., so that a raw material compound 1 was prepared.

TABLE 1

| | |
|---|---|
| EPICHLOROHYDRIN RUBBER (EO-EP-AGC TERPOLYMER, EO/EP/AGE = 73 mol %/23 mol %/4 mol %) | 100 PARTS BY MASS |
| CALCIUM CARBONATE | 60 PARTS BY MASS |
| ALIPHATIC POLYESTER-BASED PLASTICIZER | 8 PARTS BY MASS |
| ZINC STEARATE | 1 PARTS BY MASS |
| 2-MERCAPTOBENZIMIDAZOLE (MB) | 0.5 PARTS BY MASS |
| ZINC OXIDE | 5 PARTS BY MASS |
| QUARTERNARY AMMONIUM SALT | 1.5 PARTS BY MASS |
| CARBON BLACK (AVERAGE PARTICLE DIAMETER: 100 nm, VOLUME RESISTIVITY: 0.1 ohm · cm) | 5 PARTS BY MASS |

Materials shown in Table 2 were added to the raw material compound 1 thus obtained and were kneaded for 10 minutes by open rolls cooled to a temperature of 20° C., so that a conductive elastic-layer compound 1 was obtained.

TABLE 2

| | |
|---|---|
| SULFUR | 1 PARTS BY MASS |
| DIBENZOTHIAZYL DISULFIDE (DM) | 1 PARTS BY MASS |
| TETRAMETHYLTHIURAM MONOSULFIDE (TS) | 0.5 PARTS BY MASS |

The conductive elastic-layer compound 1 was extruded by a crosshead extrusion molding machine together with the conductive base to form a roller having an outside diameter of approximately 9 mm. Subsequently, heating was performed in an electric oven at a temperature of 160° C. for 1 hour, so that vulcanization and crosslinking of the adhesive were performed. Two ends of the rubber were cut off to expose the conductive base, and the length of the conductive elastic layer was set to 228 mm. Next, the surface was ground so as to form a roller shape having an outside diameter of 8.5 mm, thereby forming an elastic layer 1 with the conductive base.

Manufacturing Example 8

Materials shown in Table 3 were kneaded together for 10 minutes by a closed type mixer having an adjusted temperature of 50° C., so that a raw material compound 2 was prepared.

TABLE 3

| | |
|---|---|
| ACRYL NITRILE BUTADIENE RUBBER (NBR) (TRADE NAME: N230SV, MANUFACTURED BY JSR CORPORATION) | 100 PARTS BY MASS |
| CARBON BLACK (TRADE NAME: TOKA BLACK #7360SB, MANUFACTURED BY TOKAI CARBON CO. LTD.) | 50 PARTS BY MASS |
| CALCIUM CARBONATE | 30 PARTS BY MASS |
| ZINC STEARATE | 1 PARTS BY MASS |
| ZINC OXIDE | 5 PARTS BY MASS |

Materials shown in Table 4 were added to the raw material compound 2 thus obtained and were kneaded for 10 minutes by open rolls cooled to a temperature of 20° C., so that a conductive elastic-layer compound 2 was obtained.

TABLE 4

| | |
|---|---|
| SULFUR | 1 PARTS BY MASS |
| TETRABENZYLTHIURAM DISULFIDE (TBzTD) | 4.5 PARTS BY MASS |

An elastic layer 2 with the conductive base was obtained in a manner similar to that in Manufacturing Example 7 except this conductive elastic-layer compound 2 was used.

Manufacturing Example 9

Materials shown in Table 5 were kneaded together for 10 minutes by a closed type mixer having an adjusted temperature of 50° C., so that a raw material compound 3 was prepared.

TABLE 5

| | |
|---|---|
| EPDM (TRADE NAME: EP33, MANUFACTURED BY JSR CORPORATION) | 100 PARTS BY MASS |
| CARBON BLACK (TRADE NAME: EC-600JD, MANUFACTURED BY TOKAI CARBON CO. LTD.) | 10 PARTS BY MASS |
| PARAFFIN OIL | 50 PARTS BY MASS |
| CALCIUM CARBONATE | 50 PARTS BY MASS |
| ZINC STEARATE | 1 PARTS BY MASS |
| ZINC OXIDE | 5 PARTS BY MASS |

Materials shown in Table 6 were added to the raw material compound 3 thus obtained and were kneaded for 10 minutes by open rolls cooled to a temperature of 20° C., so that a conductive elastic-layer compound 3 was obtained.

TABLE 6

| | |
|---|---|
| SULFUR | 0.3 PARTS BY MASS |
| N-CYCLOHEXYL-2-BENZOTHIAZYLSULFENAMIDE | 1.6 PARTS BY MASS |
| ZINC DIETHYLDITHIOCARBAMATE | 1.0 PARTS BY MASS |
| TETRABUTYLTHIURAM DISULFIDE | 1.4 PARTS BY MASS |

An elastic layer 3 with the conductive base was obtained in a manner similar to that in Manufacturing Example 7 except this conductive elastic-layer compound 3 was used.

[Preparation of Resin-Layer Coating Material]

Manufacturing Example 10

Raw materials shown in Table 7 were charged in a glass bottle together with glass beads having an average particle diameter of 0.8 mm and were dispersed for 60 hours using a paint shaker dispersion machine, so that a resin-layer coating material 1 was prepared.

TABLE 7

| | |
|---|---|
| CAPROLACTONE-MODIFIED ACRYLIC POLYOL SOLUTION (TRADE NAME: PLACCEL DC2016, MANUFACTURED BY DAICEL CORPORATION) (SOLID CONTENT: 70 PERCENT BY MASS) | 100 PARTS BY MASS |
| BLOCK ISOCYANATE IPDI (TRADE NAME: VESTANAT B1370, MANUFACTURED BY DEGUSSA-HULLS AG) | 22.5 PARTS BY MASS |
| BLOCK ISOCYANATE HDI (TRADE NAME: DURANATE TPA-B80E, MANUFACTURED BY ASAHI KASEI CORPORATION) | 33.6 PARTS BY MASS |
| COMPOSITE ELECTRON CONDUCTIVE AGENT (PRODUCED IN MANUFACTURING EXAMPLE 5) | 35 PARTS BY MASS |
| SURFACE-TREATED TITANIUM OXIDE PARTICLES (PRODUCED IN MANUFACTURING EXAMPLE 6) | 21 PARTS BY MASS |
| MODIFIED DIMETHYL SILICONE OIL (TRADE NAME: SH28PA, MANUFACTURED BY DOW CORNING TORAY CO., LTD.) | 0.16 PARTS BY MASS |
| METHYL ISOBUTYL KETONE (MIBK) | 220 PARTS BY MASS |

Manufacturing Example 11

A resin-layer coating material 2 was prepared in a manner similar to that in Manufacturing Example 10 except that the amount of MIBK was changed to 328 parts by mass.

Manufacturing Example 12

A resin-layer coating material 3 was prepared in a manner similar to that in Manufacturing Example 10 except that the amount of MIBK was changed to 616 parts by mass.

Manufacturing Example 13

To the resin-layer coating material 1 of Manufacturing Example 10, 7 parts by mass of conductive zinc oxide whiskers (trade name: Pana-Tetra WZ-501, manufactured by AMTEC Co., Ltd.) each formed of a nuclear portion and four needle crystal portions extending radially outward therefrom was added, and 108 parts by mass of MIBK was further added. The mixture thus formed was dispersed for 5 minutes by a paint shaker dispersion machine containing glass beads, and the glass beads were then filtered. Accordingly, a resin-layer coating material 4 in which the four-needle zinc oxide whiskers were contained beforehand was formed.

Manufacturing Example 14

Materials shown in Table 8 were charged in a glass bottle together with glass beads having a volume average particle diameter of 0.8 mm and were dispersed for 60 hours using a paint shaker dispersion machine, so that a resin-layer coating material 5 was prepared.

TABLE 8

| | |
|---|---|
| FLUORINE RESIN DISPERSION (TETRAFLUOROETHYLENE-PERFLUOROALKYL VINYL ETHER COPOLYMER (PFA)) (TRADE NAME: AD-2CR AQUEOUS DISPERSION, MANUFACTURED BY DAIKIN INDUSTRIES, LTD.) (SOLID CONTENT CONCETRATION: 45 TO 50 PERCENT BY MASS, SPECIFIC GRAVITY: 1.4, VISCOSITY (25° C.): 250 TO 500 mPa · s) | 200 PARTS BY MASS |
| COMPOSITE ELECTRON CONDUCTIVE AGENT (PRODUCED IN MANUFACTURING EXAMPLE 5) | 50 PARTS BY MASS |
| SURFACE-TREATED TITANIUM OXIDE PARTICLES (PRODUCED IN MANUFACTURING EXAMPLE 6) | 30 PARTS BY MASS |
| PURIFIED WATER | 488 PARTS BY MASS |

Manufacturing Example 15

Materials shown in Table 9 were charged in a glass bottle together with glass beads having a volume average particle diameter of 0.8 mm and were dispersed for 60 hours using a paint shaker dispersion machine, so that a resin-layer coating material 6 was prepared.

TABLE 9

| | |
|---|---|
| ACRYLIC RESIN (TRADE NAME: ACRIT 8UA-146, MANUFACTURED BY TAISEI FINE CHEMICAL CO, LTD.) (SOLID CONTENT CONCENTRATION: 40 PERCENT BY MASS, SPECIFIC GRAVITY: 1.4, VISCOSITY: 130 mPa · s) | 200 PARTS BY MASS |
| COMPOSITE ELECTRON CONDUCTIVE AGENT (PRODUCED IN MANUFACTURING EXAMPLE 5) | 50 PARTS BY MASS |
| SURFACE-TREATED TITANIUM OXIDE PARTICLES (PRODUCED IN MANUFACTURING EXAMPLE 6) | 30 PARTS BY MASS |
| MIBK | 616 PARTS BY MASS |

Example 1

Dipping coating of the resin-layer coating material 1 produced in Manufacturing Example 10 was performed on the surface of the elastic layer 1 with the conductive base produced in Manufacturing Example 7. Dipping coating of the zinc oxide dispersion 1 produced in Manufacturing Example 1 was performed on the resin layer formed on this elastic layer. Subsequently, heating was performed at a temperature of 80° C. by an electric oven for 30 minutes to bury the four-needle zinc oxide whiskers in the resin layer, and furthermore, heating was performed at a temperature of 160° C. for 30 minutes, so that the coating film of the resin-layer coating material 1 was cross-linked. As described above, a charging roller in which the elastic layer and the surface layer were provided on the conductive base was obtained.

[Evaluation of Image Nonuniformity by Adhesion of Charged Substances]

Evaluation was performed using the charging roller as described below. First, an electrophotographic apparatus (trade name: LBP5400, manufactured by CANON Inc.) was prepared for evaluation. In addition, this electrophotographic apparatus was modified so that the output speed was 200 mm/sec.

Next, two black process cartridges for the electrophotographic apparatus, each of which included the above charging roller, were prepared, and then, the first process cartridge was first fitted in the electrophotographic apparatus, and 30,000 sheets of electrophotographic images were output.

In this case, as the image formation conditions, operation was repeatedly performed in such a way that the electrophotographic apparatus was stopped when one sheet of image was output, and the image formation operation was restarted 10 seconds later. As the output electrophotographic image, an image was formed in which letters were randomly printed in an area of one percent of an image formation area of A4-size paper. One sheet of a halftone image (an image with an intermediate image density, which is a one-dot-width horizontal line in two-dot intervals was drawn in a direction perpendicular to the rotational direction of the electrophotographic photosensitive member) was output after 30,000 sheets of electrophotographic images were output. This halftone image was visually observed.

Next, the first process cartridge was changed to the second process cartridge, and except that among the image formation conditions, a voltage applied to an intermediate transfer belt was increased by 700 V, 30,000 sheets of electrophotographic images were formed under conditions similar to the above image formation conditions. Subsequently, after the voltage applied to the intermediate transfer belt was returned to the usual voltage, one sheet of a halftone image was output and was visually observed. From the observation results of the two sheets of the halftone images, the charging roller was evaluated in accordance with the criteria described in Table 10. The results are shown in Table 12.

TABLE 10

| RANK | CRITERIA |
|---|---|
| A | Even under the image forming conditions in which the application voltage to the intermediate transfer belt is increased by +700 V, no dot-shaped density nonuniformity was observed in the halftone image. In addition, under the image forming conditions in which the application voltage to the intermediate transfer belt is set to the normal application voltage, no dot-shaped density nonuniformity was observed in the halftone image. |
| B | Under the image forming conditions in which the application voltage to the intermediate transfer belt is increased by +700 V, slight dot-shaped density nonuniformity was observed in the halftone image. However, under the image forming conditions in which the application voltage to the intermediate transfer belt is set to the normal application voltage, no dot-shaped density nonuniformity was observed in the halftone image. |
| C | Under the image forming conditions in which the application voltage to the intermediate transfer belt is increased by +700 V, apparent dot-shaped density nonuniformity was observed in the halftone image. However, under the image forming conditions in which the application voltage to the intermediate transfer belt is set to the normal application voltage, no dot-shaped density nonuniformity was observed in the halftone image. |
| D | Under the image forming conditions in which the application voltage to the intermediate transfer belt is increased by +700 V, apparent dot-shaped density nonuniformity was observed in the halftone image. In addition, under the image forming conditions in which the application voltage to the intermediate transfer belt is set to the normal application voltage, dot-shaped density nonuniformity was also observed in the halftone image. |

[Charging Sound Measurement]

The charging sound was measured under the following conditions. A measurement tool is formed of an electrophotographic photosensitive member, a charging roller, a silent motor driving the electrophotographic photosensitive member, a power supply applying a voltage to the charging roller, and a sound level meter. In this tool, the electrophotographic photosensitive member and the charging roller were in contact with each other, and when the electrophotographic photosensitive member was driven, the charging roller was rotated thereby. A voltage was applied between this charging roller and the electrophotographic photosensitive member, and a charging sound generated thereby was detected by the sound level meter.

For the electrophotographic photosensitive member, an electrophotographic photosensitive member of an electrophotographic apparatus (trade name: LBP5400, manufactured by CANON Inc.) was used. Measurement environment was in an anechoic room at a temperature of 23° C. and a humidity RH of 50%. The applied voltage was an AC+DC superposed voltage at 1,600 Hz in which Vdc was −600 V and Vpp was 1,800 V. The distance between the sound level meter and the charging roller was set to 30 cm. For evaluation of the charging sound, a sound pressure level which was the average of the A characteristics of JIS C 1505: 1988 for 8 seconds measured using a sound level meter (trade name: LA5560, manufactured by Ono Sokki Co., Ltd.) was regarded as the value of the charging sound. The results are shown in Table 12.

Examples 2 to 7

Charging rollers of Examples 2 to 7 were each produced in a manner similar to that in Example 1 except that the elastic layer with the conductive base, the resin-layer coating material, the zinc oxide whiskers, and the melt heating conditions were changed as shown in Table 11. The charging rollers thus obtained were evaluated in a manner similar to that in Example 1. The results are shown in Table 12.

Comparative Example 1

A charging roller of Comparative Example 1 was produced and evaluated in a manner similar to that in Example 2 except that the step of applying a zinc oxide dispersion was not performed.

Comparative Example 2

A charging roller of Comparative Example 2 was produced and evaluated in a manner similar to that in Comparative Example 1 except that the resin-layer coating material 4 was used instead of using the resin-layer coating material 2 of Comparative Example 1. When the exposed average length of the needle crystal portion of the obtained charging roller was observed, all the four-needle zinc oxide whiskers of the surface layer were covered with the resin layer, and the needle crystal portions of the four-needle zinc oxide whiskers were not exposed from the surface of the charging roller.

Comparative Example 3

A charging roller of Comparative Example 3 was produced and evaluated in a manner similar to that in Example 4 except that the zinc oxide dispersion 4 was used instead of using the zinc oxide dispersion 2 of Example 4. Instead of observing the exposed average length of the needle crystal portion, the height of the massive zinc oxide whiskers exposed on the resin layer and the exposed average aspect ratio of the exposed portion were calculated.

The manufacturing conditions of Examples 1 to 7 and Comparative Examples 1 to 3 are shown in Table 11, and the evaluation results thereof are shown in Table 12.

TABLE 11

| | | RESIN-LAYER COATING MATERIAL No. | MATERIAL OF RESIN LAYER | THICKNESS OF RESIN LAYER (μm) | ZINC OXIDE DISPERSION No. | AVERAGE LENGTH OF NEEDLE CRYSTAL PORTION (μm) | MELT HEATING CONDITIONS |
|---|---|---|---|---|---|---|---|
| EXAMPLE | 1 | 1 | THERMOSETTING URETHANE | 4 | 1 | 21 | 80° C. 30 minutes, 160° C. 30 minutes |
| | 2 | 2 | THERMOSETTING URETHANE | 12 | 1 | 21 | 80° C. 30 minutes, 160° C. 30 minutes |

TABLE 11-continued

| | | RESIN-LAYER COATING MATERIAL No. | MATERIAL OF RESIN LAYER | THICKNESS OF RESIN LAYER (μm) | ZINC OXIDE DISPERSION No. | AVERAGE LENGTH OF NEEDLE CRYSTAL PORTION (μm) | MELT HEATING CONDITIONS |
|---|---|---|---|---|---|---|---|
| | 3 | 3 | THERMOSETTING URETHANE | 19 | 1 | 21 | 80° C. 30 minutes, 160° C. 30 minutes |
| | 4 | 2 | THERMOSETTING URETHANE | 12 | 2 | 10 | 80° C. 30 minutes, 160° C. 30 minutes |
| | 5 | 2 | THERMOSETTING URETHANE | 12 | 3 | 6 | 80° C. 30 minutes, 160° C. 30 minutes |
| | 6 | 2 | THERMOSETTING URETHANE | 12 | 2 | 10 | 80° C. 5 minutes, 160° C. 30 minutes |
| | 7 | 2 | THERMOSETTING URETHANE | 12 | 2 | 10 | 160° C. 30 minutes |
| COMPARATIVE EXAMPLE | 1 | 2 | THERMOSETTING URETHANE | 12 | NONE | — | 80° C. 30 minutes, 160° C. 30 minutes |
| | 2 | 4 | THERMOSETTING URETHANE | 12 | NONE | 10 | 80° C. 30 minutes, 160° C. 30 minutes |
| | 3 | 2 | THERMOSETTING URETHANE | 12 | 4 | 11(*) | 80° C. 30 minutes, 160° C. 30 minutes |

(*)VOLUME AVERAGE WHISKER DIAMETER OF MASSIVE ZINC OXIDE WHISKERS

TABLE 12

| | EXPOSED AVERAGE LENGTH OF NEEDLE CRYSTAL PORTION (μm) | EXPOSED AVERAGE ASPECT RATIO OF NEEDLE CRYSTAL PORTION | IMAGE NONUNIFORMITY DUE TO STAINS | CHARGING SOUND (dB) |
|---|---|---|---|---|
| EXAMPLE 1 | 19 | 24 | A | 54 |
| EXAMPLE 2 | 15 | 30 | A | 57 |
| EXAMPLE 3 | 8 | 10 | B | 63 |
| EXAMPLE 4 | 7 | 14 | B | 61 |
| EXAMPLE 5 | 4 | 8 | C | 66 |
| EXAMPLE 6 | 8 | 16 | B | 60 |
| EXAMPLE 7 | 9 | 18 | B | 62 |
| COMPARATIVE EXAMPLE 1 | 0 | — | D | 74 |
| COMPARATIVE EXAMPLE 2 | 0 | — | D | 71 |
| COMPARATIVE EXAMPLE 3 | MASSIVE EXPOSED PORTION 7 | MASSIVE EXPOSED PORTION 0.6 | D | 69 |

Examples 8 to 13

Charging rollers of Examples 8 to 13 were produced in a manner similar to that in Example 1 except that the resin-layer coating material, the zinc oxide whiskers, and the melt heating conditions were changed as shown in the following Table 13. The charging rollers thus obtained were evaluated in a manner similar to that in Example 1.

Comparative Examples 4 and 5

Charging rollers of Comparative Examples 4 and 5 were produced and evaluated in a manner similar to that in Comparative Example 3 except that the resin-layer coating material and the melt heating conditions were changed as shown in the following Table 13.

The manufacturing conditions of Examples 8 to 13 and Comparative Examples 4 and 5 are shown in Table 13, and the evaluation results thereof are shown in Table 14.

TABLE 13

| | | RESIN-LAYER COATING MATERIAL No. | MATERIAL OF RESIN LAYER | THICKNESS OF RESIN LAYER (μm) | ZINC OXIDE DISPERSION No. | AVERAGE LENGTH OF NEEDLE CRYSTAL PORTION (μm) | MELT HEATING CONDITIONS |
|---|---|---|---|---|---|---|---|
| EXAMPLE | 8 | 5 | THERMOPLASTIC FLUORINE RESIN | 9 | 1 | 21 | 320° C. 30 minutes |
| | 9 | 5 | THERMOPLASTIC FLUORINE RESIN | 9 | 2 | 10 | 320° C. 30 minutes |

TABLE 13-continued

|  |  | RESIN-LAYER COATING MATERIAL No. | MATERIAL OF RESIN LAYER | THICKNESS OF RESIN LAYER (μm) | ZINC OXIDE DISPERSION No. | AVERAGE LENGTH OF NEEDLE CRYSTAL PORTION (μm) | MELT HEATING CONDITIONS |
|---|---|---|---|---|---|---|---|
|  | 10 | 5 | THERMOPLASTIC FLUORINE RESIN | 9 | 3 | 6 | 320° C. 30 minutes |
|  | 11 | 6 | THERMOPLASTIC ACRYLIC RESIN | 6 | 1 | 21 | 100° C. 60 minutes |
|  | 12 | 6 | THERMOPLASTIC ACRYLIC RESIN | 6 | 2 | 10 | 100° C. 60 minutes |
|  | 13 | 6 | THERMOPLASTIC ACRYLIC RESIN | 6 | 3 | 6 | 100° C. 60 minutes |
| COMPARATIVE EXAMPLE | 4 | 5 | THERMOPLASTIC FLUORINE RESIN | 9 | 4 | 11(*) | 320° C. 30 minutes |
|  | 5 | 6 | THERMOPLASTIC ACRYLIC RESIN | 6 | 4 | 11(*) | 100° C. 60 minutes |

(*)VOLUME AVERAGE WHISKER DIAMETER OF MASSIVE ZINC OXIDE WHISKERS

TABLE 14

|  | EXPOSED AVERAGE LENGTH OF NEEDLE CRYSTAL PORTION (μm) | EXPOSED AVERAGE ASPECT RATIO OF NEEDLE CRYSTAL PORTION | IMAGE NONUNIFORMITY DUE TO STAINS | CHARGING SOUND (dB) |
|---|---|---|---|---|
| EXAMPLE 8 | 14 | 18 | A | 59 |
| EXAMPLE 9 | 5 | 10 | B | 65 |
| EXAMPLE 10 | 2 | 4 | C | 68 |
| COMPARATIVE EXAMPLE 4 | MASSIVE EXPOSED PORTION 5 | MASSIVE EXPOSED PORTION 0.5 | D | 73 |
| EXAMPLE 11 | 18 | 23 | A | 55 |
| EXAMPLE 12 | 7 | 14 | B | 63 |
| EXAMPLE 13 | 3 | 15 | C | 66 |
| COMPARATIVE EXAMPLE 5 | MASSIVE EXPOSED PORTION 6 | MASSIVE EXPOSED PORTION 0.6 | D | 71 |

Examples 14 to 19

Charging rollers of Examples 14 to 19 were produced in a manner similar to that in Example 1 except that the elastic layer with the conductive base, the resin-layer coating material, the zinc oxide whiskers, and the melt heating conditions were changed as shown in the following Table 15. The respective charging rollers thus obtained were evaluated in a manner similar to that in Example 1.

Comparative Examples 6 and 7

Charging rollers of Comparative Examples 6 and 7 were produced in a manner similar to that in Comparative Example 3 except that the elastic layer with the conductive base was changed as shown in the following Table 15.

The manufacturing conditions of Examples 14 to 19 and Comparative Examples 6 and 7 are shown in Table 15, and the evaluation results thereof are shown in Table 16.

TABLE 15

|  |  | ELASTIC LAYER WITH CONDUCTIVE BASE LAYER No. | RESIN-LAYER COATING MATERIAL No. | MATERIAL OF RESIN LAYER | THICKNESS OF RESIN LAYER (μm) | ZINC OXIDE DISPERSION No. | AVERAGE LENGTH OF NEEDLE CRYSTAL PORTION (μm) | MELT HEATING CONDITIONS |
|---|---|---|---|---|---|---|---|---|
| EXAMPLE | 14 | 2 | 2 | THERMOSETTING URETHANE | 5 | 1 | 21 | 80° C. 30 minutes, 160° C. 30 minutes |
|  | 15 | 2 | 2 | THERMOSETTING URETHANE | 5 | 2 | 10 | 80° C. 30 minutes, 160° C. 30 minutes |
|  | 16 | 2 | 2 | THERMOSETTING URETHANE | 5 | 3 | 6 | 80° C. 30 minutes, 160° C. 30 minutes |
|  | 17 | 3 | 2 | THERMOSETTING URETHANE | 4 | 1 | 21 | 80° C. 30 minutes, 160° C. 30 minutes |
|  | 18 | 3 | 2 | THERMOSETTING URETHANE | 4 | 2 | 10 | 80° C. 30 minutes, 160° C. 30 minutes |

TABLE 15-continued

|  | ELASTIC LAYER WITH CONDUCTIVE BASE LAYER No. | RESIN-LAYER COATING MATERIAL No. | MATERIAL OF RESIN LAYER | THICKNESS OF RESIN LAYER (μm) | ZINC OXIDE DISPERSION No. | AVERAGE LENGTH OF NEEDLE CRYSTAL PORTION (μm) | MELT HEATING CONDITIONS |
|---|---|---|---|---|---|---|---|
|  | 19 | 3 | 2 | THERMOSETTING URETHANE | 4 | 3 | 6 | 80° C. 30 minutes, 160° C. 30 minutes |
| COMPARATIVE EXAMPLE | 6 | 2 | 2 | THERMOSETTING URETHANE | 5 | 4 | 11(*) | 80° C. 30 minutes, 160° C. 30 minutes |
|  | 7 | 3 | 2 | THERMOSETTING URETHANE | 4 | 4 | 11(*) | 80° C. 30 minutes, 160° C. 30 minutes |

(*)VOLUME AVERAGE WHISKER DIAMETER OF MASSIVE ZINC OXIDE WHISKERS

TABLE 16

|  | EXPOSED AVERAGE LENGTH OF NEEDLE CRYSTAL PORTION (μm) | EXPOSED AVERAGE ASPECT RATIO OF NEEDLE CRYSTAL PORTION | IMAGE NONUNIFORMITY DUE TO STAINS | CHARGING SOUND (dB) |
|---|---|---|---|---|
| EXAMPLE 14 | 17 | 28 | A | 54 |
| EXAMPLE 15 | 7 | 23 | B | 64 |
| EXAMPLE 16 | 5 | 25 | B | 63 |
| COMPARATIVE EXAMPLE 6 | 8 (MASSIVE EXPOSED PORTION) | 0.7 (MASSIVE EXPOSED PORTION) | D | 69 |
| EXAMPLE 17 | 18 | 18 | A | 56 |
| EXAMPLE 18 | 8 | 9 | C | 65 |
| EXAMPLE 19 | 4 | 5 | C | 67 |
| COMPARATIVE EXAMPLE 7 | 9 (MASSIVE EXPOSED PORTION) | 0.8 (MASSIVE EXPOSED PORTION) | D | 70 |

From comparison between Examples and Comparative Examples shown in Tables 11 to 16, it is found that since the conductive zinc oxide whiskers each formed of a nuclear portion and four needle crystal portions extending radially outward therefrom are exposed from the resin layer to form the convex portions of the surface layer, adhesion or fixing of substances, such as tonner particles and external additives, on the surface of the charging member are suppressed, and the density nonuniformity generated in the electrophotographic image is suppressed.

In addition, it is found that as the exposed average length and the exposed average aspect ratio of the needle crystal portion are increased, adhesion or fixing of substances, such as tonner particles and external additives are suppressed, and as a result, an effect of suppressing the generation of density nonuniformity in the electrophotographic image can be enhanced.

In addition, it is found that although the roughness was approximately equivalent between Example 4 and Comparative Example 3, a roller having needle-like convex portions has a more significant improvement effect of the charging sound. Furthermore, it is found that among the charging members in which the conductive zinc oxide whiskers each formed of a nuclear portion and four needle crystal portions extending radially outward therefrom are exposed from the resin layer to form the convex portions of the surface layer, as the exposed average length and the exposed average aspect ratio of the needle crystal portion are increased, the effect of suppressing a charging sound is enhanced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

11 . . . conductive zinc oxide whiskers each formed of a nuclear portion and four needle crystal portions extending radially outward therefrom,
12 . . . surface layer

The invention claimed is:

1. A method for manufacturing a charging member provided with a surface layer, wherein the surface layer includes conductive zinc oxide whiskers, wherein each zinc oxide whisker includes a nuclear portion and four needle crystal portions extending radially outward from the nuclear portion, and wherein at least one of the needle crystal portions is exposed on a surface of the surface layer to form a convex portion on the surface of the surface layer, the method comprising:
   (1) forming a resin layer used as a base of the surface layer;
   (2) dispersing the conductive zinc oxide whiskers in a solvent which does not dissolve a resin in the resin layer;
   (3) applying the conductive zinc oxide whiskers dispersed in the solvent to the resin layer; and
   (4) melting the resin layer with the applied conductive zinc oxide whiskers to bury a part of the conductive zinc oxide whiskers in the resin layer.

2. The method according to claim 1, wherein the needle crystal portions exposed on the surface of the surface layer have an exposed average aspect ratio of 10 or more and an exposed average length of 5 μm or more.

3. The method according to claim 2, wherein the exposed average aspect ratio is 30 or less and the exposed average length is 19 μm or less.

4. The method according to claim 1, wherein the resin layer comprises a thermosetting resin.

5. The method according to claim 4, wherein the thermosetting resin is a thermosetting urethane resin.

* * * * *